(12) United States Patent
Kitahara (10) Patent No.: US 6,273,558 B1
(45) Date of Patent: Aug. 14, 2001

(54) PIEZOELECTRIC VIBRATOR UNIT, MANUFACTURING METHOD THEREOF, AND INK JET RECORDING HEAD INCORPORATING THE SAME

(75) Inventor: Tsuyoshi Kitahara, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/394,706

(22) Filed: Sep. 13, 1999

(30) Foreign Application Priority Data

Sep. 17, 1998 (JP) .................................................. 10-263199

(51) Int. Cl.[7] ...................................................... B41J 2/045
(52) U.S. Cl. .................................. 347/72; 347/68; 347/70; 347/71
(58) Field of Search .......................................... 347/68–72

(56) References Cited

U.S. PATENT DOCUMENTS 5,350,969 * 9/1994 Gattuso .................................. 313/446
5,444,471 * 8/1995 Usui et al. .............................. 347/72

FOREIGN PATENT DOCUMENTS

| 4-1052 | 1/1992 | (JP) | ................................ | B41J/2/045 |
| 7-195688 | 8/1995 | (JP) | ................................ | B41J/2/045 |

* cited by examiner

Primary Examiner—John Barlow
Assistant Examiner—An H. Do
(74) Attorney, Agent, or Firm—Sughrue, Mion, Zinn, Macpeak & Seas, PLLC (57) ABSTRACT

In order to simplify a step of forming a conductive layer for external connection and improve the reliability thereof, at least either internal individual electrodes or internal common electrodes, which include of a piezoelectric vibrator, are connected with each other at through holes situated spaced away from an end face of the piezoelectric vibrator and connected to either a segment electrode of a common electrode, which are formed on one surface in a longitudinal direction of the piezoelectric vibrator. According, it is not necessary to form a conductive layer on the end face or a corner portion where such a layer is hardly formed. Furthermore, even if such portions are slightly broken, the conductivity can be maintained.

14 Claims, 7 Drawing Sheets

PIEZOELECTRIC VIBRATOR UNIT, MANUFACTURING METHOD THEREOF, AND INK JET RECORDING HEAD INCORPORATING THE SAME

BACKGROUND OF THE INVENTION

The present invention relates to a piezoelectric vibrator unit in which internal electrodes are stacked in parallel with the expansion/contraction axis, and more particularly to the structure of internal electrodes, and also to an ink jet recording head.

As disclosed in Japanese Patent Publication No. 4-1052A, in an ink jet recording head using a piezoelectric vibrator of the longitudinal vibration mode, an elastic plate is placed via a small gap on the back face of a nozzle plate in which plural nozzles are opened, and piezoelectric vibrators having the piezoelectric constant d31, which are obtained by dividing so as to correspond to respective pressure generating chambers of a channel substrate, abuts against the back face of the elastic plate. Ink in a reservoir is guided into the pressure generating chambers via associated ink supply ports, and the ink is then pressurized by the piezoelectric vibrators which are driven by a recording signal, thereby causing the ink to be ejected from the nozzle orifices.

As disclosed in Japanese Patent Publication No. 7-195688A, for example, such a piezoelectric vibrator is configured in the following manner. It is prepared a single piezoelectric diaphragm in which common electrodes and internal individual electrodes are alternately stacked on each other while sandwiching a piezoelectric material therebetween. In the piezoelectric diaphragm, the internal common electrodes are exposed from a rear end face on the side of the fixed end, and the internal individual electrodes are exposed from a front end face on the side of the free end. The piezoelectric diaphragm is divided such that dummy piezoelectric vibrators are arranged in both sides thereof, and driving piezoelectric vibrators are formed into a comb-like shape in the central portion thereof so that their non-vibrating regions are continuous.

The internal individual electrodes are connected to a segment electrode which elongates from the front end face to a top face of a non-vibrating region, and the internal common electrodes to a common electrode which elongates from the rear end face to the top face of the non-vibrating region. A driving signal is supplied to the segment electrode and the common electrode via a flexible cable.

As described above, the external electrodes, which constitute the segment electrode and the common electrode, are formed in an L-like shape on the two faces, i.e., the end faces and the top face. Therefore, there arise problems in that conductive failure easily occurs in a conductive layer in the interface between the end face and the top face, and hence the formation of the conductive layer requires much labor, and that corner edges tend to be broken and a connection failure thereby occurs, thereby lowering the production yield.

SUMMARY OF THE INVENTION

The invention has been conducted in view of these problems. It is a first object of the present invention to provide a piezoelectric vibrator unit in which, even when corner edges are slightly broken, the conduction relationship is ensured.

It is a second object of the present invention to provide a method of manufacturing such a piezoelectric vibrator unit.

It is a third object of the present invention to provide an ink jet recording head incorporating such a piezoelectric vibrator unit.

In order to solve the problems, according to the present invention, there are fixed on a fixing substrate a plurality of piezoelectric vibrators in which internal individual electrodes and internal common electrodes are alternately and overlappingly stacked on each other while sandwiching piezoelectric materials therebetween in an area where is to be a vibrating region thereof, comprising: a through hole piercing through the piezoelectric materials in at least one end portions thereof for being filled with a conductive material such that at least either the first conductive layers or the second conductive layers are connected with each other; and an external electrode layer formed on one surface in a longitudinal direction of the piezoelectric vibrators for connecting the conductive material in the through hole.

The conductive layers on the internal individual electrodes or the internal common electrodes constituting the piezoelectric vibrators are electrically connected with each other and drawn out to a the top face in the longitudinal direction thereof via the through holes arranged inner than the end faces of the piezoelectric vibrators. Therefore, it is not necessary to form conductive layers on the end faces or the corner edge where such a layer is hardly formed.

BRIEF DESCRIPTION OF THE DRAWINGS

In the accompanying drawings:

FIGS. 8A and 8B are section views showing another embodiment of the present invention.

FIGS. 9A and 9B are section views showing other embodiments of the present invention.

DETAILED DESCRIPTION OF THE PREFERRED EMBODIMENTS

Hereinafter, the present invention will be described in detail on the basis of illustrated embodiments.

Figure 1:
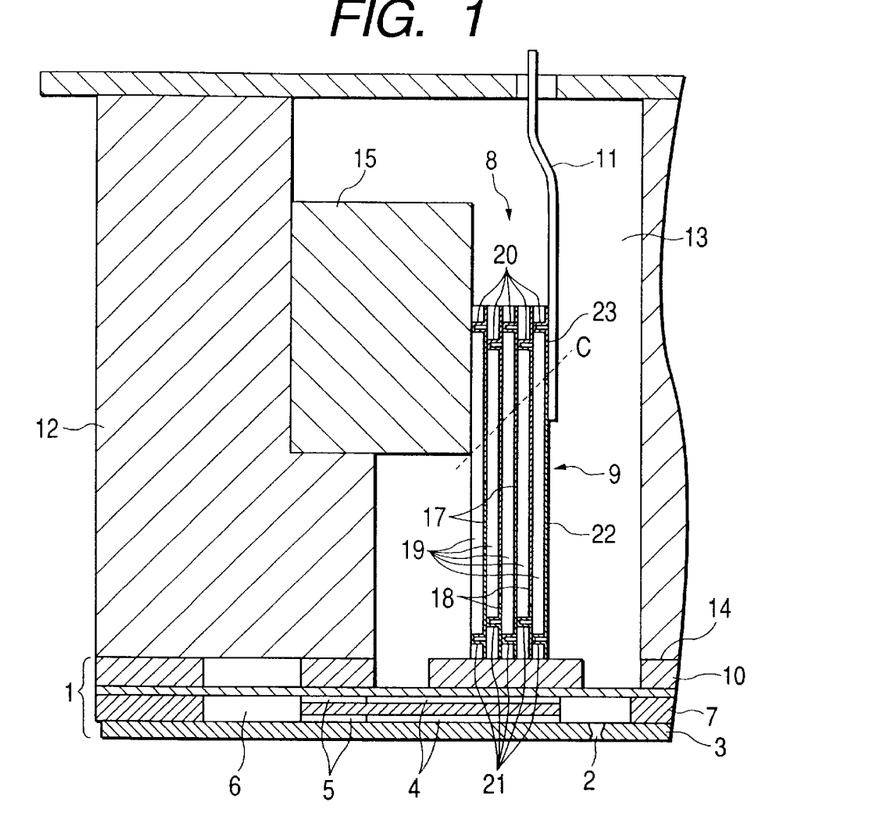
FIG. 1 is a view of one embodiment of the ink jet recording head according to the present invention and showing the section structure in a region of piezoelectric vibrators.

FIG. 1 shows an embodiment of the ink jet recording head according to the present invention. A channel unit 1 is configured by integrally stacking: a nozzle plate 3 in which nozzle orifices 2 are formed at a constant pitch; a channel substrate 7 comprising pressure generating chambers 4 respectively communicating with the associated nozzle orifices 2, and a reservoir 6 for supplying ink to the respective pressure generating chambers 4 via associated ink supply ports 5; and an elastic plate 10 which abuts against front ends of piezoelectric vibrators 9 of the longitudinal vibration mode in a piezoelectric vibrator unit 8, so as to expand and contract the capacity of each of the pressure generating chambers 4.

The piezoelectric vibrator unit 8 is connected to a flexible cable 11 through which an external driving signal is transmitted, and then housed in and fixed to an unit chamber 13 of a head holder 12; and the channel unit 1 is fixed to an opening face 14 of the head holder 12, thereby constituting the recording head.

In the piezoelectric vibrator unit 8, the piezoelectric vibrators 9 of the piezoelectric constant d31 are fixed to a fixing substrate 15 so as to coincide with the arrangement pitch of the pressure generating chambers 4, and as required, dummy piezoelectric vibrators which are slightly wider are fixed to the fixing substrate 15 and at both ends in the arrangement direction of the piezoelectric vibrators 9.

Figure 2:
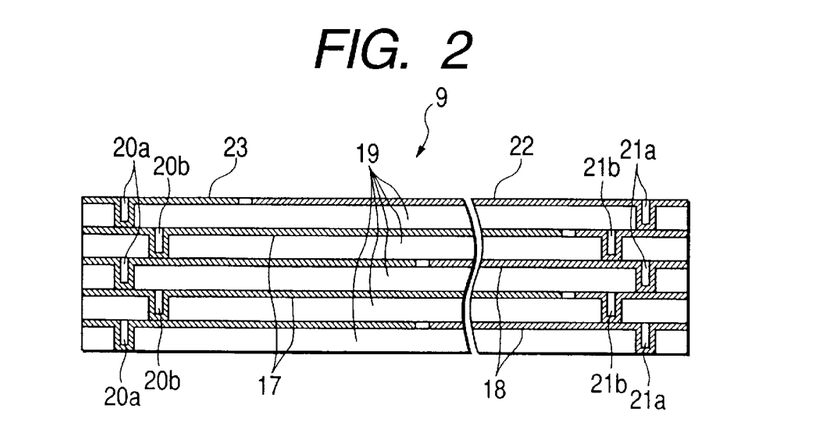
FIG. 2 is an enlarged section view showing the piezoelectric vibrators of the recording head.

As shown in FIG. 2, in the piezoelectric vibrators 9, internal common electrodes 17 and internal individual electrodes 18 are alternately stacked on each other while sandwiching a piezoelectric material 19 therebetween. The internal common electrodes 17 are electrically connected to one another in parallel via a conductive layer filling through holes 20 which are opened in an area on the side of the fixed end. The internal individual electrodes 18 are electrically connected to one another in parallel via a conductive layer filling through holes 21 which are opened in an area on the side of the free end. A segment electrode 22 and a common electrode 23 serving also as the internal individual electrodes are formed on the top face of the piezoelectric vibrator 9. The flexible cable 11 is connected to the electrodes 22 and 23.

In the embodiment, the through holes 20a and 20b, and 21a and 21b in adjacent two layers are slightly shifted from each other in a direction of the expansion/contraction axis (hereinafter, axial direction), so that the through holes of alternate layers are positioned on one line.

Figure 3A:
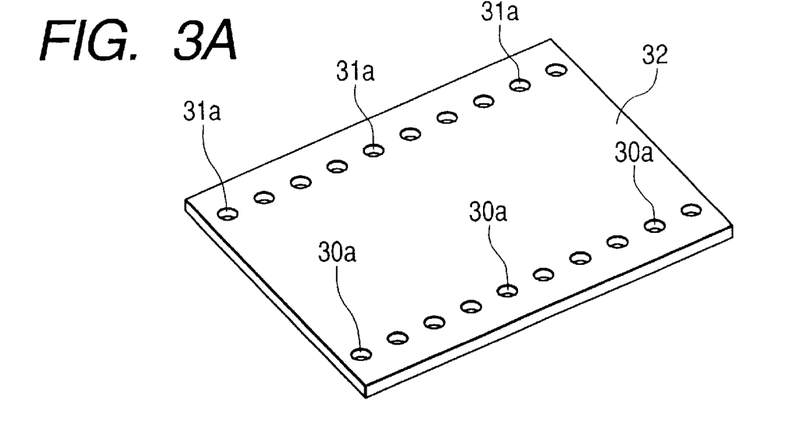
FIGS. 3A to 3C are views showing steps of the first half of a method of manufacturing the piezoelectric vibrators.
Figure 3B:
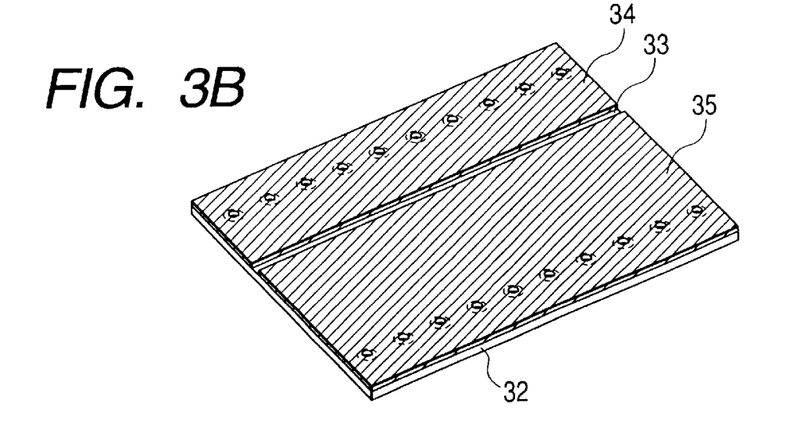

FIGS. 3A–3B show an embodiment of the method of manufacturing the piezoelectric vibrator unit. A green sheet 32 of a piezoelectric material and having a predetermined thickness is prepared. In the green sheet, through holes 30a and 31a are opened in the vicinity of both ends thereof so as to coincide with the arrangement pitch of the piezoelectric vibrators (FIG. 3A). On the surface of the sheet, a strip-like non-conductive region 33 is formed in a region which is nearer to a center portion than the through holes 31a and which coincides with the front ends of the internal common electrodes 17. Conductive layers 34 and 35 are formed by, for example, printing of a conductive coating material so as to fill the inside of the through holes 30a and 31a (FIG. 3B).

FIG. 3 shows an embodiment of the method of manufacturing the piezoelectric vibrator unit. A green sheet 32 of a piezoelectric material and having a predetermined thickness is prepared. In the green sheet, through holes 30a and 31a are opened in the vicinity of both ends thereof so as to coincide with the arrangement pitch of the piezoelectric vibrators (FIG. 3A). On the surface of the sheet, a strip-like non-conductive region 33 is formed in a region which is nearer to a center portion than the through holes 31a and which coincides with the front ends of the internal common electrodes 17. Conductive layers 34 and 35 are formed by, for example, printing of a conductive coating material so as to fill the inside of the through holes 30a and 31a (FIG. 3B).

Figure 3C:
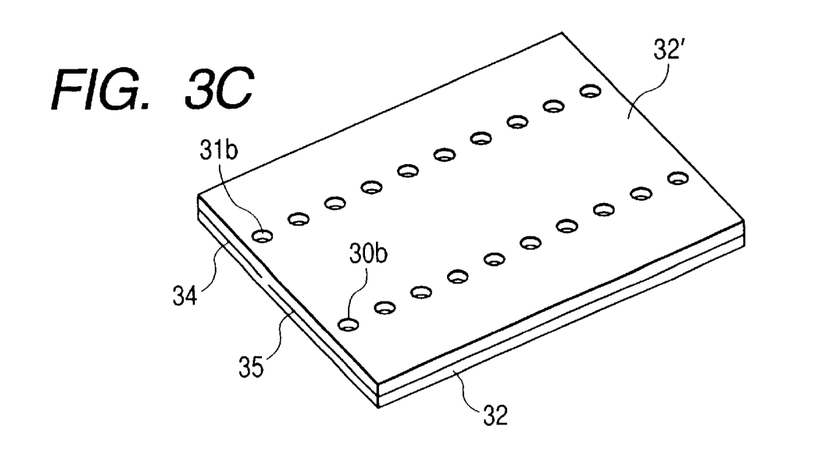
Figure 4A:
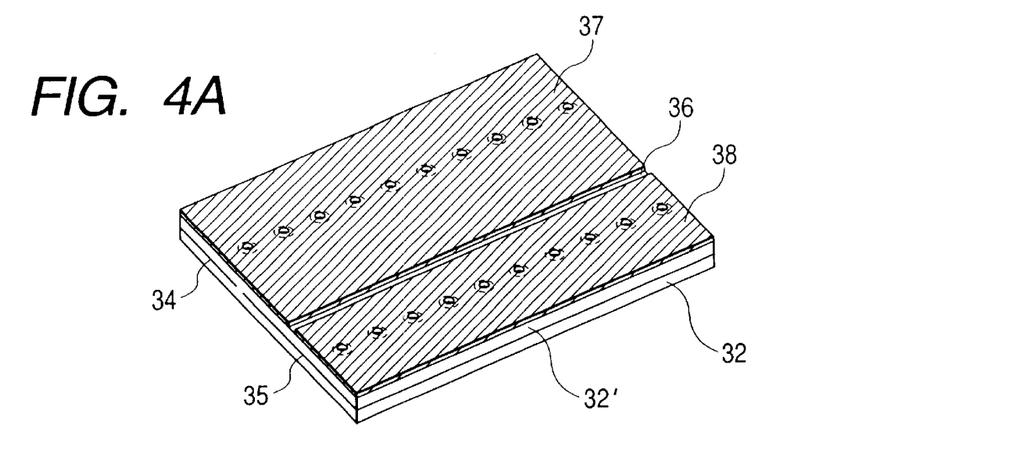
FIGS. 4A to 4C are views showing steps of the second half of the method of manufacturing the piezoelectric vibrators.

A green sheet 32' of a piezoelectric material and having a predetermined thickness is stacked on the green sheet 32. In the green sheet 32', through holes 30b and 31b are opened at positions which are slightly different from the through holes 30a and 31a in the axial direction of the piezoelectric vibrators (FIG. 3C). On the surface of the sheet, a strip-like non-conductive region 36 is formed in a region which is nearer to a center portion than the through holes 30b and which coincides with the front ends of the internal individual electrodes 18. Conductive layers 37 and 38 are formed so as to fill the inside of the through holes 30b and 31b (FIG. 4A).

When the through holes 30a, 30b, 31a, and 31b are formed so that the width in at least one direction is larger than the thickness of the green sheet 32 or 32', the conductive coating material which forms the conductive layers can be surely filled into the through holes 30a, 30b, 31a, and 31b.

Figure 4B:
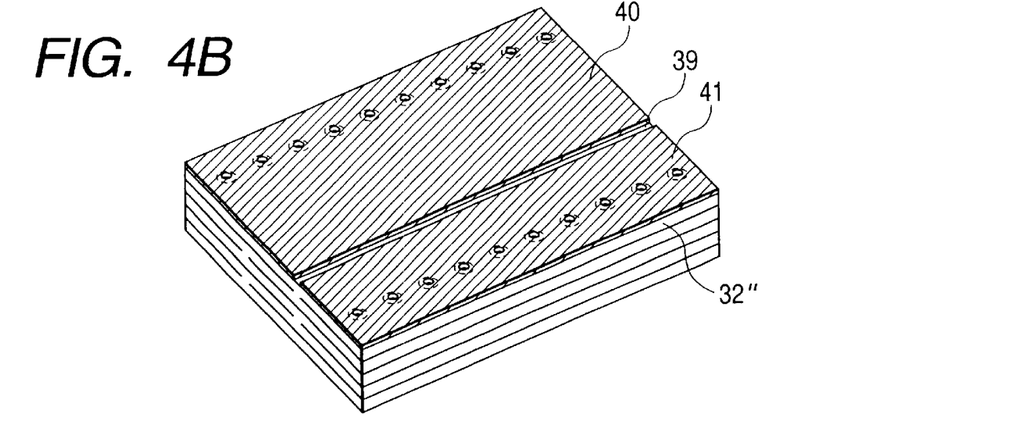

Thereafter, the above-mentioned steps are alternatingly repeated to stack a required number of layers, so that a green sheet 32" in which through holes 30a and 31a (30b and 31b) are opened in the same manner as described above is stacked, a strip-like non-conductive region 39 is formed in the interface between the segment electrode 22 and the common electrode 23, and conductive layers 40 and 41 are formed so as to fill the insides of the through holes 30a and 31a (30b and 31b) (FIG. 4B).

Figure 4C:
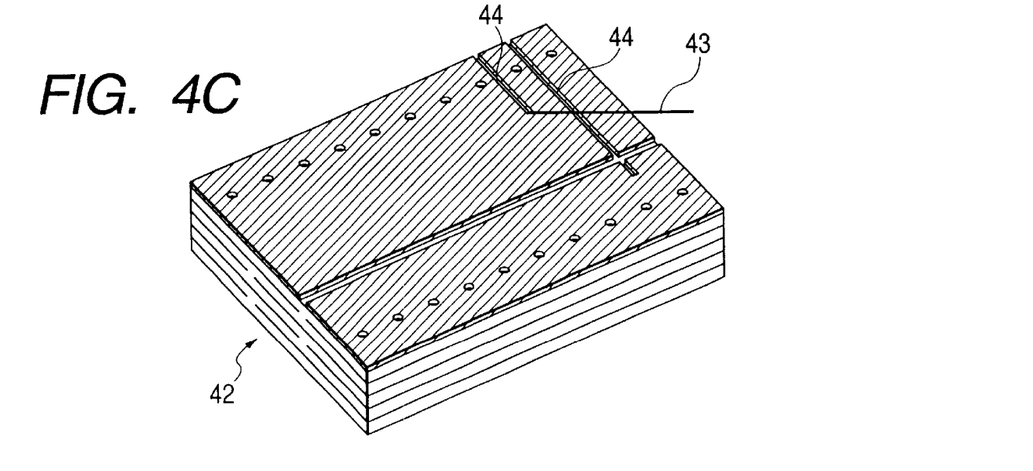

The green sheets of the piezoelectric material are dried and then baked so as to constitute a single piezoelectric material diaphragm 42. Slits 44 are formed at a pitch which coincides with the arrangement pitch of the through holes 31a (31b) on the side of the front end serving as the free end, by oblique cutting lines C (see FIG. 1). The cutting lines are formed by a cutting tool 43 such as a wire saw or a dicing saw which is advanced to an area where at least the conductive layer 40 can be split into mutually separated portions, in such a manner that each slit is formed as a slope a top end of which is situated in the rear end side and a bottom end of which is situated in the front end side. As a result, the diaphragm is cut into a comb-like shape so that the rear end side is a continuous portion (FIG. 4C).

Figure 5:
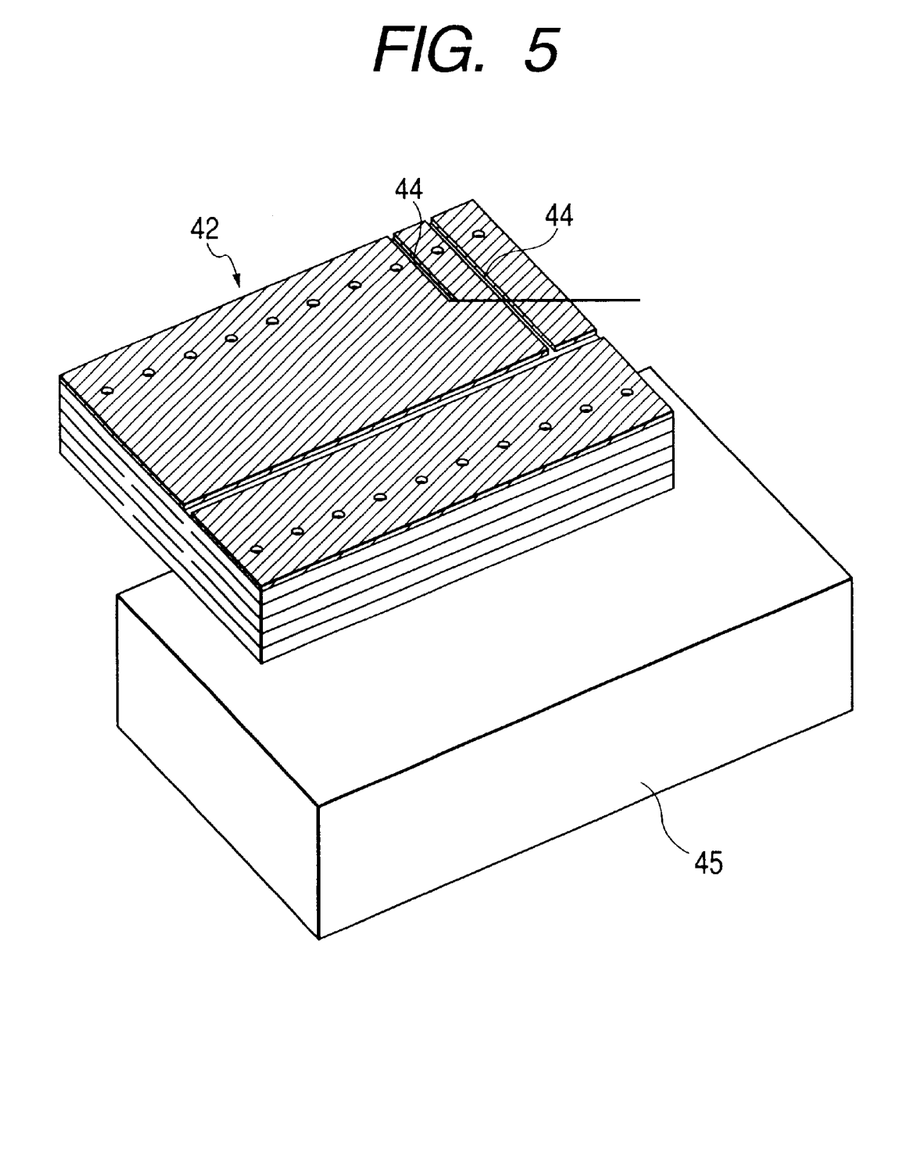
FIG. 5 is a view showing a method of manufacturing the piezoelectric vibrators according to another embodiment of the present invention.

In the embodiment, the slits are formed in the piezoelectric material diaphragm 42. Alternatively, as shown in FIG. 5, the slits 44 may be formed after the non-vibrating regions are fixed to a fixing substrate 45 by means of an adhesive agent or the like. In the alternative, the working efficiency can be improved.

In the thus configured ink jet recording head, when a driving signal is supplied through the flexible cable 11, the driving signal is applied to the internal individual electrodes 18 via the segment electrode 22 and the through holes 21a and 21b of each layer, and to the internal common electrodes 17 via the common electrode 23 and the through holes 20a and 20b of each layer, with the result that the layers of the piezoelectric material 19 contract in the axial direction.

The capacity of the corresponding one of the pressure generating chambers 4 is thus expanded. Therefore, the ink in the reservoir 6 flows into the pressure generating chamber 4 via the ink supply port 5. When the supply of the driving signal is stopped after elapse of a predetermined time period, the piezoelectric vibrator 9 returns to its original state to relatively contract the capacity of the pressure generating chamber 4, whereby an ink droplet is ejected from the nozzle orifice 2.

Figure 6:
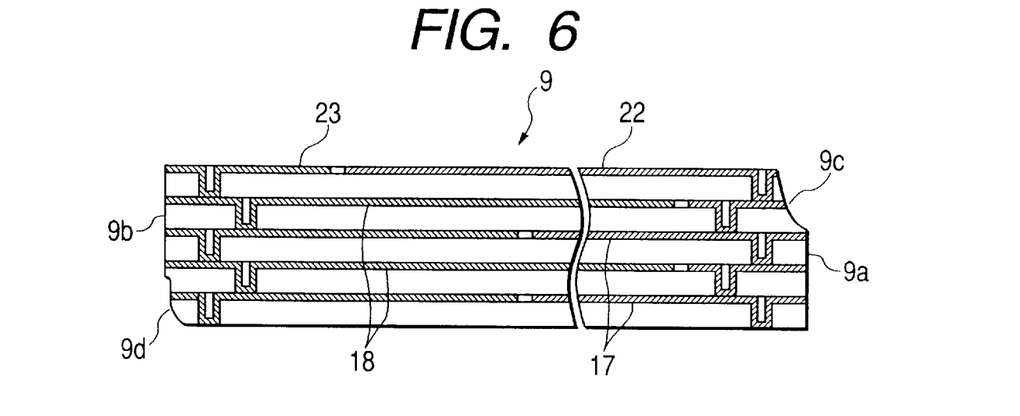
FIG. 6 is a view showing a state where breakages are formed in end faces of the piezoelectric vibrators.

No external electrode for connection exists on the front end face 9a and the rear end face 9b of each of the piezoelectric vibrators 9. Even when minute breakages 9c and 9d which are not so large and hence does not reach the through holes 20 and 21 exist as shown in FIG. 6, therefore, the conduction relationships among the segment electrode 22 or the common electrode 23 and the internal individual electrodes 18 or the internal common electrodes 17 can be maintained. According to this configuration, even when breakages are formed during a process of splitting the single piezoelectric material diaphragm 42 by forming slits into the individual piezoelectric vibrators 9, or that of mounting the unit into a recording head, there arises no substantial disadvantage and the production yield can be improved.

Figure 7:
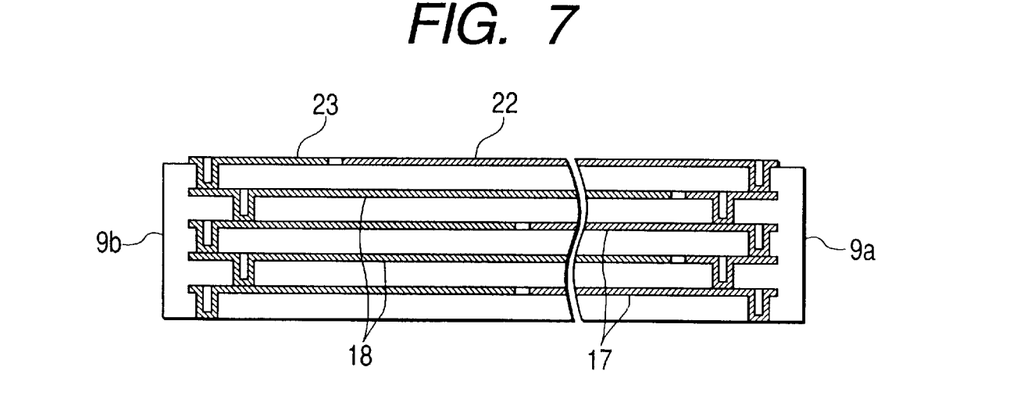
FIG. 7 is a section view showing another embodiment of the present invention.

In the above embodiment, the internal common electrodes 17, the internal individual electrodes 18, the segment electrode 22, and the common electrode 23 are formed so that their ends are exposed to the outside from the both end faces of the piezoelectric vibrator 9. Alternatively, as shown in FIG. 7, these electrodes may be formed so that their ends are positioned between the through holes 20 or 21 and the front end face 9a or the rear end face 9b. In the alternative, even when a conductive material abuts against the end faces 9a and 9b, the internal common electrodes 17 and the internal individual electrodes 18 are prevented from being short-circuited.

Figure 8A:
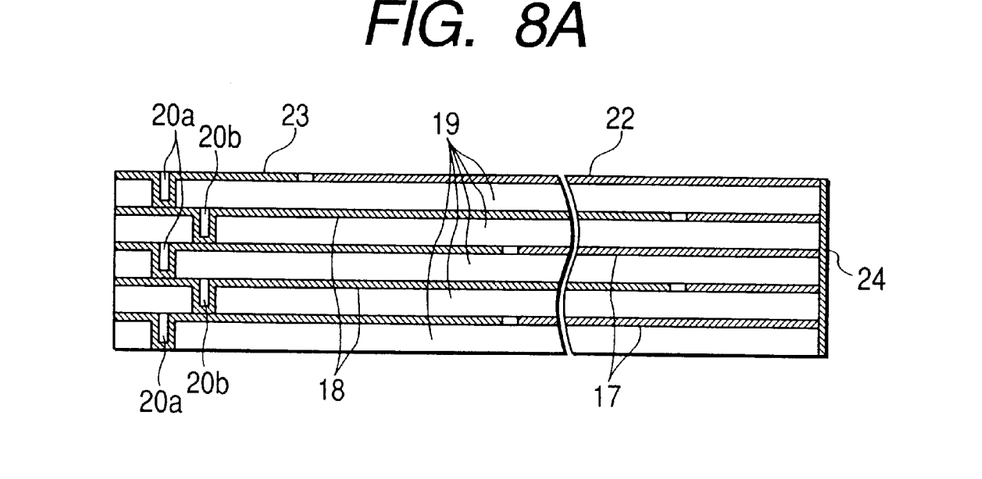
FIGS. 8A and 8B are section views showing another embodiments of the present invention.
Figure 8B:
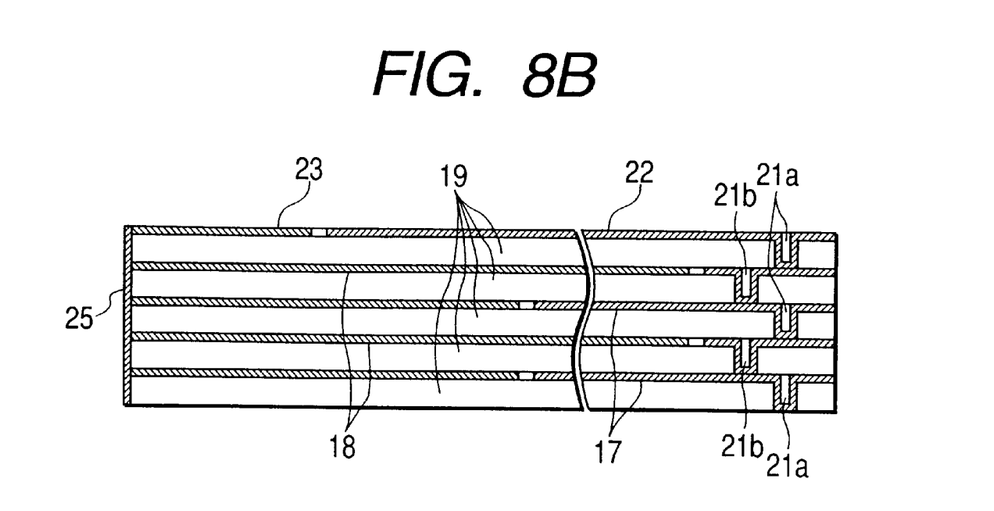

In the above embodiment, the connection among the internal common electrodes 17, and that among the internal individual electrodes 18 are attained by means of the through holes 20 and 21, respectively. Alternatively, as shown in FIGS. 8A and 8B, an external electrode 24 or 25 may be formed on one of the front end face and the rear end face, and the internal common electrodes 17 or the internal individual electrodes 18 may be connected to one another in parallel via the external electrode 24 or 25, and then connected to the common electrode 23 or the segment electrode 22. Also in the alternative, the production yield can be improved.

Figure 9A:
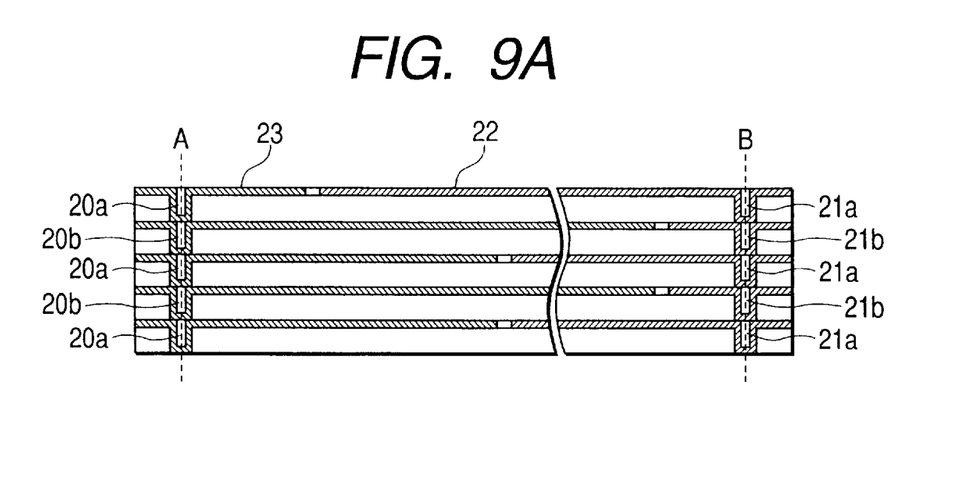
FIGS. 9A and 9B are section views showing another embodiments of the present invention.
Figure 9B:
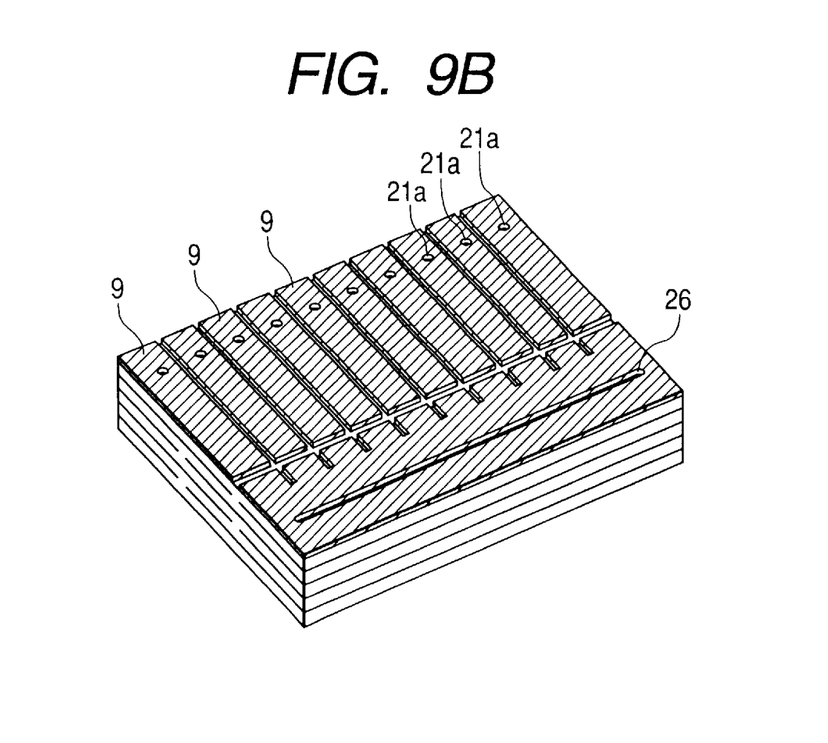

In the above embodiment, the through holes 20a and 20b, or 21a and 21b in the layers are slightly shifted with each other in the axial direction. Alternatively, as shown in FIG. 9A, the through holes may be formed on the same axial line A or B, or, as shown in FIG. 9B, the through holes on the side of the fixed end may be formed as a through slit 26. Also in the alternatives, the same effects can be attained.

As described above, according to the present invention, there are fixed on a fixing substrate a plurality of piezoelectric vibrators in which internal individual electrodes and internal common electrodes are alternately and overlappingly stacked on each other while sandwiching piezoelectric materials therebetween in an area where is to be a vibrating region thereof, comprising: a through hole piercing through the piezoelectric materials in at least one end portions thereof for being filled with a conductive material such that at least either the first conductive layers or the second conductive layers are connected with each other; and an external electrode layer formed on one surface in a longitudinal direction of the piezoelectric vibrators for connecting the conductive material in the through hole. Accordingly, the internal individual electrodes constituting the piezoelectric vibrators, or the internal common electrodes can be connected to one another via the through holes which are positioned inside the end face of the piezoelectric vibrators, so as to be drawn to the surface of the longitudinal direction. Therefore, formation of a conductive layer is not required on an end face or an edge where such a layer is hardly formed. As a result, the reliability can be enhanced.

Furthermore, no external electrode exists on an end face of each piezoelectric vibrator in which breakages are formed in a relatively easy manner. Even when breakages are formed during a step of splitting the piezoelectric vibrators into a comb-like shape or mounting the vibrator unit into a recording head, therefore, there arises no substantial disadvantage and the production yield can be improved.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A piezoelectric vibrator unit in which first conductive layers to be internal individual electrodes and second conductive layers to be internal common electrodes are alternately and overlappingly stacked on each other with piezoelectric materials sandwiched therebetween, comprising;

through holes piercing through the piezoelectric materials in at least one end portion thereof, said through holes being filled with a conductive material such that at least one of the first conductive layers and the second conductive layers is connected to said one of the first conductive layers and the second conductive layers; and a first external electrode layer for connecting the conductive material in the through holes.

2. The piezoelectric vibrator unit as set forth in claim 1, wherein the unit includes a plurality of piezoelectric vibrators and the through holes for connecting the first conductive layers are formed in every piezoelectric vibrator.

3. The piezoelectric vibrator unit as set forth in claim 2, wherein the piezoelectric vibrators are divided into a comb-like shape by slits such that non-vibrating regions of the respective piezoelectric vibrators are connected with each other.

4. The piezoelectric vibrator unit as set forth in claim 2, wherein one face extending in a longitudinal direction of the piezoelectric vibrators is fixed to a fixing base.

5. The piezoelectric vibrator unit as set forth in claim 1, wherein the conductive layers in which the through holes are formed are electrically connected by the conductive material filling the through holes.

6. The piezoelectric vibrator unit as set forth in claim 1, wherein the through holes are situated on the same line.

7. A piezoelectric vibrator unit as set forth in claim 1, wherein the through holes of alternate ones of the first and second conductive layers are situated on the same line.

8. The piezoelectric vibrator unit as set forth in claim 1, wherein end faces of the respective conductive layers are situated nearer to a center portion than end faces of the piezoelectric vibrator.

9. The piezoelectric vibrator unit as set forth in claim 1, wherein a width of the through hole is larger than a thickness of the piezoelectric materials.

10. The piezoelectric vibrator unit as set forth in claim 1, wherein the first external electrode layer is made of a material identical with a material of the internal individual electrodes, and internal common electrodes.

11. The piezoelectric vibrator unit as set forth in claim 1, wherein the piezoelectric vibrator is of logitudinal vibration type which expands and contracts in a direction perpendicular to the stacking direction of the conductive layers and piezoelectric materials.

12. The piezoelectric vibrator unit as set forth in claim 1, wherein a segment electrode, and a common electrode are provided as the external electrode layer.

13. The piezoelectric vibrator unit as set forth in claim 1, wherein a second external electrode connected to the external electrode layer is provided on an end portion of the piezoelectric vibrator a side of which the through hole is absent.

14. An ink jet recording head comprising:

a piezoelectric vibrator unit in which first conductive layers to be internal individual electrodes and second conductive layers to be internal common electrodes are alternately and overlappingly stacked on each other with piezoelectric material sandwiched therebetween, including:

through holes piercing through the piezoelectric materials in at least one of end portion of thereof, said through holes being filled with conductive material such that at least one of the first conductive layers are connected with each other and the second conductive layers are connected with each other; and an external electrode layer for connecting the conductive material in the through holes, a channel unit including a pressure generating chamber pressurized by the piezoelectric vibrator unit, which communicates with both of a reservoir and a nozzle orifice; and a head holder for holding the piezoelectric vibrator unit and the channel unit.

* * * * *